US010191094B2

(12) United States Patent
Yao et al.

(10) Patent No.: US 10,191,094 B2
(45) Date of Patent: Jan. 29, 2019

(54) SYNCHROPHASOR MEASUREMENT METHOD FOR POWER SYSTEMS

(71) Applicants: University of Tennessee Research Foundation, Knoxville, TN (US); UT-BATTELLE, LLC, Oak Ridge, TN (US)

(72) Inventors: Wenxuan Yao, Knoxville, TN (US); Jiecheng Zhao, Knoxville, TN (US); Yilu Liu, Knoxville, TN (US); Andrew N. Herron, Kingston, TN (US); Daniel J. King, Powell, TN (US); Thomas J. King, Jr., Knoxville, TN (US); Lingwei Zhan, Knoxville, TN (US)

(73) Assignees: University of Tennessee Research Foundation, Knoxville, TN (US); UT-Battelle, LLC, Oak Ridge, TN (US)

( * ) Notice: Subject to any disclaimer, the term of this patent is extended or adjusted under 35 U.S.C. 154(b) by 113 days.

(21) Appl. No.: 15/609,484

(22) Filed: May 31, 2017

(65) Prior Publication Data

US 2018/0348266 A1    Dec. 6, 2018

(51) Int. Cl.
*G01R 19/25* (2006.01)
(52) U.S. Cl.
CPC ............... *G01R 19/2513* (2013.01)
(58) Field of Classification Search
CPC .... G01R 19/25; G01R 19/2513; G01R 21/00; G01R 25/00; Y02E 60/728
See application file for complete search history.

(56) References Cited

U.S. PATENT DOCUMENTS

| | | | | |
|---|---|---|---|---|
| 6,662,124 | B2* | 12/2003 | Schweitzer | H02H 1/0007 324/76.15 |
| 2006/0215064 | A1* | 9/2006 | Dawson | H03L 7/081 348/730 |
| 2006/0247874 | A1* | 11/2006 | Premerlani | G01R 19/2513 702/64 |
| 2013/0193951 | A1* | 8/2013 | Korovin | G01R 19/2513 324/76.39 |
| 2013/0338954 | A1* | 12/2013 | Seki | G01R 19/2513 702/75 |

(Continued)

*Primary Examiner* — Huy Q Phan
*Assistant Examiner* — David Frederiksen
(74) *Attorney, Agent, or Firm* — Myers Bigel, P.A.

(57) ABSTRACT

A synchrophasor measurement method for a device configured to take synchronized measurements in a power system is provided. The synchrophasor measurement method includes receiving global positioning system (GPS)-synchronized samples of a signal sensed by the device from the power system; determining a level of distortion of the signal; selecting, based on the level of distortion, a computation method, the computation method being one of an improved zero-crossing (IZC) method and an enhanced phase-lock-loop (EPLL) method; performing the selected computation method to determine at least one parameter of the signal at a reporting frequency, which is at least twice a line frequency of the power system; and outputting, at the reporting frequency, the at least one parameter to an operator of the power system to allow the operator to perform at least one of a monitoring and a controlling of at least one element of the power system.

20 Claims, 7 Drawing Sheets

(56) References Cited

U.S. PATENT DOCUMENTS

| | | | |
|---|---|---|---|
| 2014/0032143 A1* | 1/2014 | Luo | G01R 19/2513 |
| | | | 702/64 |
| 2015/0089027 A1* | 3/2015 | Zweigle | H04L 43/065 |
| | | | 709/219 |
| 2015/0222123 A1* | 8/2015 | Manson | G05B 19/058 |
| | | | 700/287 |
| 2016/0091537 A1* | 3/2016 | Gaarder | G06Q 10/00 |
| | | | 324/764.01 |

* cited by examiner

SYNCHROPHASOR MEASUREMENT METHOD FOR POWER SYSTEMS

STATEMENT REGARDING FEDERALLY SPONSORED RESEARCH OR DEVELOPMENT

This invention was made with government support under the U.S. Department of Energy Grid Modernization Laboratory Consortium (GMLC) and EEC-1041877 awarded by the U.S. National Science Foundation and the U.S. Department of Energy. The U.S. Government has certain rights in this invention.

BACKGROUND

The present disclosure generally relates to electric power systems and synchronized phasor (or synchrophasor) measurement methods for rapid situational awareness of electric power systems.

Synchronized measurements of currents and voltages at nodes throughout electric power systems, also known as power grids, are typically limited by slow responses and low reporting rates of devices used for the measurements. An example of such devices is a Phasor Measurement Unit (PMU). Conventional PMUs employ measurement algorithms that are generally based on discrete Fourier transform (DFT) and that estimate a frequency and/or a phase angle from either current or voltage measurements over a window spanning six line cycles (i.e., 0.1 seconds for a 60-Hz power grid). Moreover, given that the IEEE C37.118 standard for PMUs prescribes a low reporting rate requirement, commercial PMUs are designed and manufactured to have typical data rates ranging from 10 Hz to 60 Hz, which are not fast enough for dynamic response prediction and transient stability control of power grids. Consequently, neither fast dynamic response (e.g., within one line cycle) nor reliable and accurate measurements during transients (due to sudden changes in power generation and/or power-consuming loads in the power grids) may be provided by current commercial PMUs. Therefore, conventional PMUs are not suited for transient stability control.

Low-latency frequency and angle measurements may benefit power grid situational awareness, event analysis, and transient stability control. Furthermore, they may extend power grid visibility during transients, dynamics, oscillation, first swing, frequency instability, voltage instability, etc. High data rate may allow for dynamic response prediction and may increase the accuracy of power system model validation. Therefore, the inventors recognized a need in the art for fast synchronized measurement methods for rapid situational awareness of power grids.

DETAILED DESCRIPTION

An embodiment of the present disclosure provides a synchrophasor measurement method for a device configured to take synchronized measurements in a power system. The synchrophasor measurement method includes receiving global positioning system (GPS)-synchronized samples of a signal sensed by the device from the power system; determining a level of distortion of the signal; selecting, based on the level of distortion, a computation method, the computation method being one of an improved zero-crossing (IZC) method and an enhanced phase-lock-loop (EPLL) method; performing the selected computation method to determine at least one parameter of the signal at a reporting frequency, which is at least twice a line frequency of the power system; and outputting, at the reporting frequency, the at least one parameter to an operator of the power system to allow the operator to perform at least one of a monitoring and a controlling of at least one element of the power system.

Another embodiment of the present disclosure provides an electronic device for a power system. The electronic device comprise a sensor, a GPS receiver, one or more processors, and storing instructions adapted to be executed by the one or more processors to perform the synchrophasor measurement method.

Figure 1:
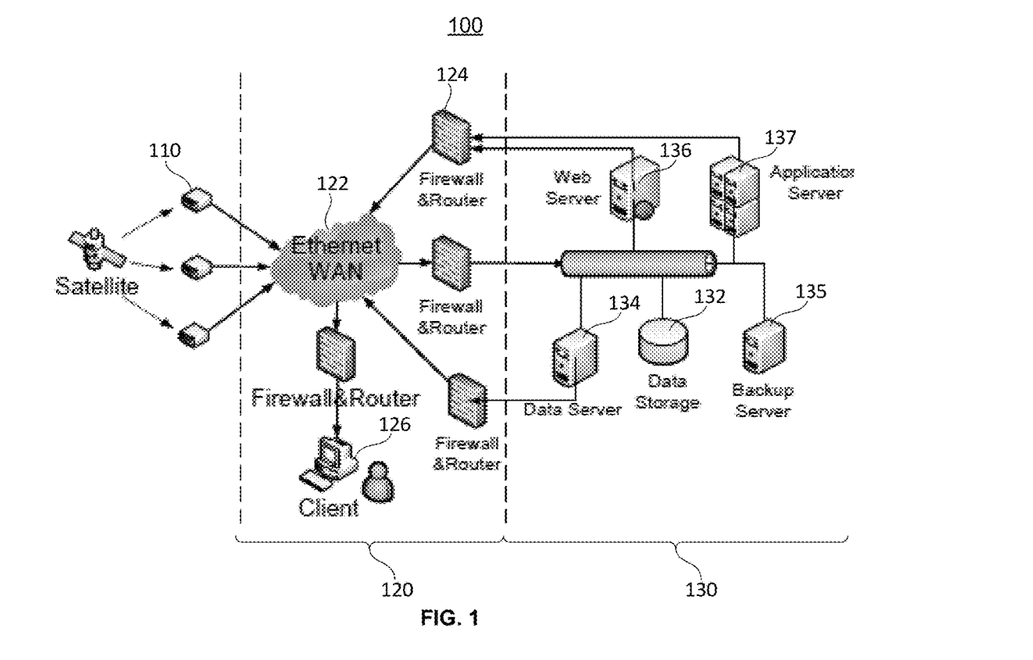
FIG. 1 illustrates an exemplary framework of a monitoring network for a power grid, according to an embodiment of the present disclosure.

FIG. 1 illustrates an exemplary framework of a monitoring network 100 for a power grid, according to an embodiment of the present disclosure. The network 100 may consist of one or more synchronized measurement devices 110, which may perform local global positioning system (GPS)-synchronized measurements and send data to an information management system (IMS) 130 through the Internet 120.

The synchronized measurement devices 110 are typically sparsely installed to perform the local measurements at different locations across the power grid. The synchronized measurement devices 110 generally include voltage and/or current sensors to make voltage and/or current measurements. The synchronized measurement devices 110 may include one or more processors and memory storing instructions to be executed by the one or more processors to determine the frequency, phase angle, etc. of the voltage and/or current measurements locally. It is to be appreciated that the synchronized measurement devices 110 are not limited to any particular device, and may refer to any sensor that uses synchrophasor measurement technology. Each synchronized measurement devices 110 may include a GPS receiver providing a GPS-based synchronization signal (e.g., pulse per second (PPS), inter-range instrumentation group B (IRIG-B)), which may be used for sampling control in the synchronized measurement device 110.

The Internet 120 may serve as a wide-area communication network (WAN) 122 with a plurality of firewalls/routers 124 to connect the synchronized measurement devices 110 and one or more clients 126 to the IMS 130. The IMS 130 may collect the sampled measured data and/or the computed data from the synchronized measurement devices 110, store the data in databases in data storage devices 132, and provide a platform for analyses of the data either before or after storing the data. The servers 134-137 in the IMS 130 may include a plurality of processors to manipulate and analyze the stored data serially and/or in parallel. The servers 134-137 may be centrally or distributedly located. Data generated from the analyses of the stored data may also be stored in the data storage devices 132. The data storage devices 132 may include secondary or tertiary storage to allow for non-volatile or volatile storage of the measured, computed, and generated data. The IMS 130 may be entirely contained at one location or may also be implemented across a closed or local network, an internet-centric network, or a cloud platform.

The IMS 130 may provide the measured and/or computed data, either before or after storing the data, to the one or more clients 126. Alternatively, the sampled measured data and/or the computed data may be transmitted directly from the synchronized measurement devices 110 to the clients 126 via the Internet 120. The data received at the clients 126 may be displayed on one or more displays and/or further manipulated by one or more processors for analysis, monitoring, and control of the power grid either automatically by computer systems or visually and manually by one or more operators of the power grid. Based on the synchrophasor data, one or more devices/equipment such as generators, transformers, switches, capacitors, transmission lines, power-consuming loads, etc. in the power grid may be controlled automatically by the computer systems or manually by the one or more operators, in order to maintain the stability and safe operation of the power grid.

To allow for fast synchrophasor measurements for rapid situational awareness, event analysis, and transient stability control, it is desirable for the synchronized measurement devices 110 to have sampling rates, which are higher than those of conventional PMUs, for faster response. For example, the sampling rates of the synchronized measurement devices 110 may range from 720 Hz to 100 kHz. The synchronized measurement devices 110 may be configured to adjust their sampling rates, for example, based on the quality of the signal(s) being measured. Furthermore, it is desirable for the synchronized measurement devices 110 to be equipped with measurement methods/algorithms that are capable of continuously measuring/estimating the frequency, phase angle, etc. of the power grid as sample(s) of voltage and/or current signals become available. Such synchronized measurement devices 110 thus do not require a window spanning six line cycles to estimate the frequency, phase angle, etc. and may have reporting rates of 120 Hz or higher, which are much faster than the typical PMU data rates that range from 10 Hz to 60 Hz.

Figure 2:
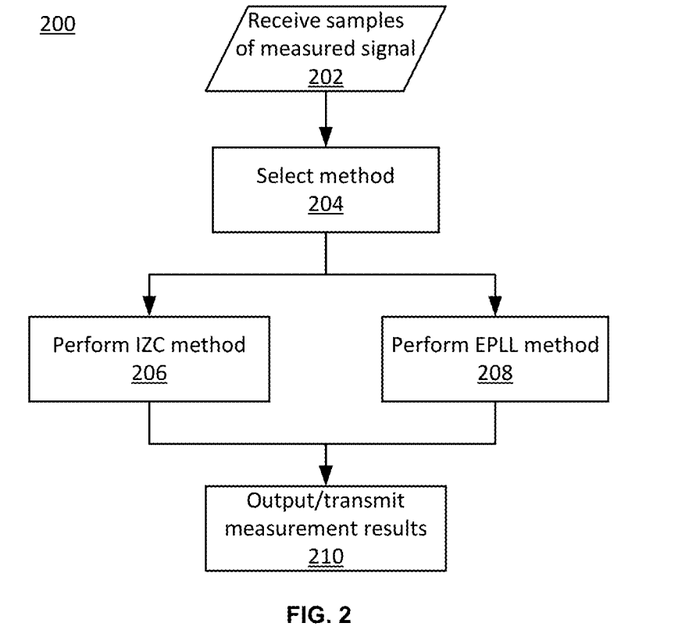
FIG. 2 illustrates a synchrophasor measurement method for a synchronized measurement device, according to an embodiment of the present disclosure.

FIG. 2 illustrates a synchrophasor measurement method 200 for a synchronized measurement device (e.g., synchronized measurement devices 110 in FIG. 1), according to an embodiment of the present disclosure. The method 200 starts at step 202 by receiving synchronized samples of a measured signal of a power grid. For example, samples of a voltage/current signal may be available from a voltage/current detection device or a voltage/current sensor of the synchronized measurement device. At step 204, the method 200 determines one or more characteristics of the measured signal from the samples and, based on the characteristics of the measured signal, selects between an improved zero-crossing (IZC) method and an enhanced phase-lock-loop (EPLL) method for estimating the frequency, phase angle, etc. of the measured signal. The IZC and EPLL methods will be described below. For example, at step 204, if the method 200 determines from the samples that the measured signal is highly distorted, the method 200 selects the IZC method. Otherwise, the method 200 selects the EPLL method. The level of distortion of the measured signal may be determined in a number of ways known in the art, for example, by computing its total harmonic distortion (THD). The method 200 may adjust the sampling rate of the synchronized measurement device based on the selected method. For example, the method 200 may increase the sampling rate for the IZC method (e.g., 100 kHz) and decrease the sampling rate for the EPLL method (e.g., between 720 Hz and 36 kHz). The method 200 then performs either the IZC method at step 206 or the EPLL method at step 208. Finally, the method 200 outputs/transmits, from the synchronized measurement device (e.g., to the IMS 130 in FIG. 1), measured/estimated results from either the IZC method or the EPLL method.

Improved Zero-Crossing Method

Figure 3:
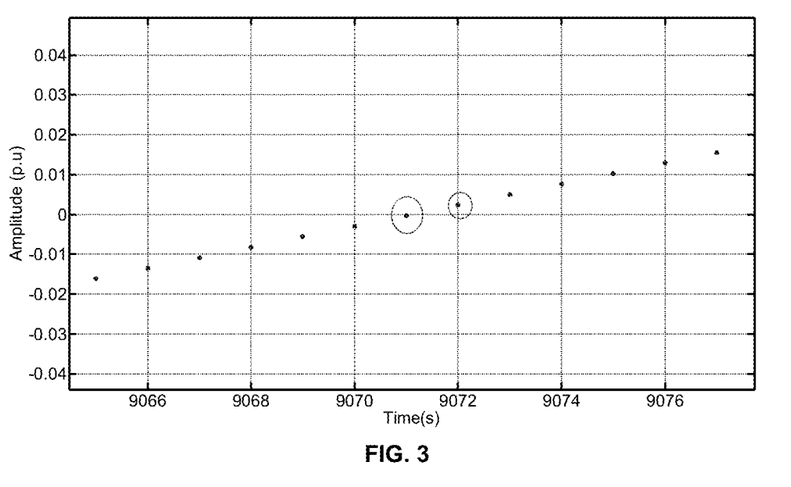
FIG. 3 illustrates samples of an exemplary measured signal around a zero crossing.

FIG. 3 illustrates samples of an exemplary measured signal x around a zero crossing. For such a signal, which is relatively free of noise, a conventional function, given in equation (1), may be employed to determine a zero-crossing location:

$$(x(i)-D) \times (x(i+1)-D) \leq 0 \qquad (1)$$

In equation (1), $x(i)$ and $x(i+1)$ represent two consecutive samples of the measured signal x. The parameter D represents a direct-current (DC) offset in the measured signal x and may be determined, for example, by continuously or periodically averaging samples of the signal x over at least one line cycle. A zero crossing location may be identified to be between the $i^{th}$ and $(i+1)^{th}$ samples whenever the inequality in equation (1) is satisfied. From consecutive zero crossing locations, frequency and phase angle of the measured signal may be determined.

Figure 4:
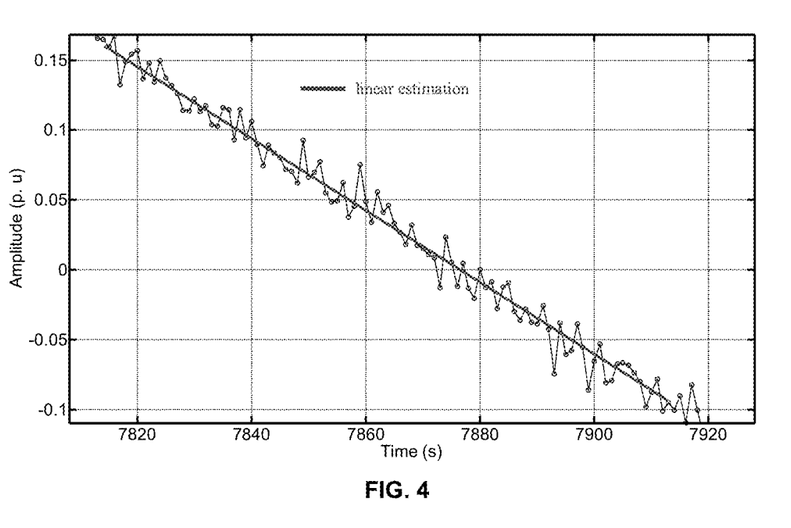
FIG. 4 illustrates samples of an exemplary measured signal around a zero crossing.

However, it is common for power grid signals to contain ~40-80 dB white noise. As the noise level of a measured signal increases, its waveform may not be a monotonic function and there may be several samples around a zero crossing, as illustrated in FIG. 4, for example. For such a noisy (highly-distorted) signal, equation (1) may result in erroneous zero crossing locations and, consequently, erroneous measured/estimated frequencies and phase angles. To address this issue, the IZC method may be employed to effectively generate a linear estimation of the measured signal (as illustrated in FIG. 4) around zero crossing locations, from which more accurate zero crossing locations may be determined.

Figure 5:
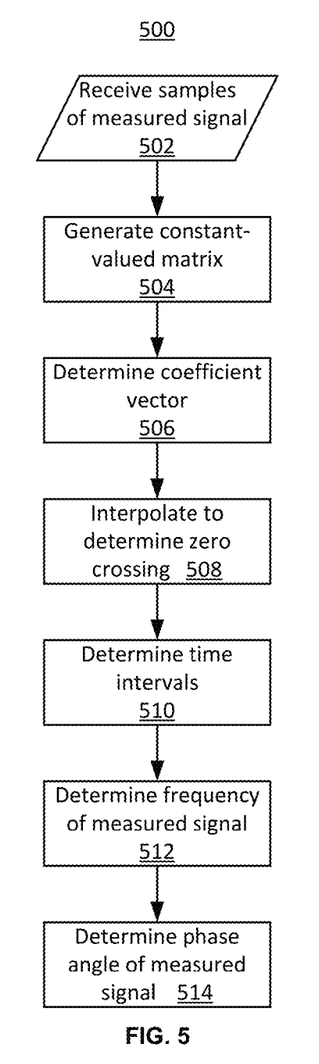
FIG. 5 is a flowchart of an improved zero-crossing (IZC) method, according to an embodiment of the present disclosure.

FIG. 5 is a flowchart depicting the IZC method 500, according to an embodiment of the present disclosure. The IZC method 500 starts by receiving samples $x(n)$ of the measured signal x at step 502. With the assumption that, around zero crossing locations, the measured signal x changes as a first-order polynomial function with respect to time, the linear function in equation (2) may be used for polynomial fitting:

$$x(n) = \alpha_0 + \alpha_1 n \qquad (2)$$

At step 504, given a sample vector $x = [x(1), x(2), \ldots, x(m)]$ of m samples around each zero crossing location, the IZC method generates a constant-valued matrix M by converting equation (2) into matrix form as in equation (3).

$$x = \alpha M \qquad (3)$$

where a coefficient vector $\alpha = [\alpha_0, \alpha_1]$. The constant-valued matrix M may thus be expressed as:

$$M = \begin{bmatrix} 1 & 1 \\ 1 & 2 \\ \vdots & \vdots \\ 1 & m \end{bmatrix} \quad (4)$$

Since the matrix M and the sample vector x are known, the IZC method 500 may determine, at step 506, the coefficient vector α by the following pseudo-inverse computation:

$$\alpha = [M^T M]^{-1} M^T x \quad (5)$$

Once the coefficient vector α determined, at step 508, the IZC method 500 interpolates between the m samples to generate a polynomial function and determines a zero crossing location as the point where the polynomial function is zero. Every time the IZC method 500 determines a zero crossing location, at step 510, the IZC method 500 also determines a first time interval $T_1$ between the zero crossing location (i.e., the last zero crossing location) and the second-to-last zero crossing location, and a second time interval $T_2$ between the second-to-last zero crossing location and the third-to-last zero crossing location, as in equation (6).

$T_1 = T_s \times$(sample count of last zero crossing−sample count of second-to-last zero crossing)

$T_2 = T_s \times$(sample count of second-to-last zero crossing−sample count of third-to-last zero crossing) (6)

In equation (6), $T_s$ is the sampling period of the synchronized measurement device.

At step 512, the IZC method 500 computes the frequency f of the measured signal x using equation (7).

$$f = \frac{1}{T_1 + T_2} \quad (7)$$

After calculating the frequency f the IZC method 500 calculates the phase angle φ of the measured signal x as follows at step 514:

$$\varphi = 2\pi T \frac{1}{f} \quad (8)$$

In equation (8), T represents the time between the last zero-crossing location and a reference time, e.g., a PPS signal from a GPS receiver of the synchronized measurement device.

Since the measured signal x may have a DC offset, the minimum window length of the IZC method is one line cycle (i.e., 1/60 seconds for a 60-Hz power grid). It is important for the IZC method 500 to, continuously or periodically, remove the DC offset from the measure signal x prior to determining the zero crossing locations. The DC offset in the measured signal x may be determined, for example, by continuously or periodically averaging samples of the measured signal x over at least one line cycle. Given that the IZC method 500 calculates the frequency f and the angle φ at every zero crossing location, the maximum output rate of the IZC method 500 is 120 Hz, which is faster than conventional DFT output rate of 10 Hz to 60 Hz. Accordingly, the IZC method 500 is suitable for rapid power grid situational awareness, event analysis, and transient stability control.

It is to be appreciated that, for the IZC method 500, the resolution is directly related to the sampling rate. The resolution r of the IZC method can be expressed as:

$$r = f_s \times \left( \frac{1}{\text{floor } (f_s/f_0)} - \frac{1}{\text{floor } (f_s/f_0) + 1} \right) \quad (9)$$

where $f_0$ is the nominal power grid frequency (e.g., 60 Hz), $f_s$ is the sampling frequency (i.e., $f_s = 1/T_s$), and "floor( )" is a function that rounds its operand down to the nearest integer. The limitation of the resolution r is due to the integer restraint when counting the samples between two zero-crossing locations and the fact that, typically, a sample is not identically zero. Increasing the sampling rate is the most effective method to improve the frequency measurement accuracy for the IZC method.

It is to be also appreciated that the implementation of the IZC method 500 is not limited to any particular programming language or execution environment, and the method 200 may be applied to any computer programming languages or logic.

Enhanced Phase-Lock-Loop Method

An EPLL method estimates the magnitude, phase angle, angular frequency, and DC offset of a measured signal u, which may be represented by equation (9), as one or more samples of the measured signal u become available. The EPLL method generates an estimated signal y represented by equation (10), and corrects the estimated signal y based on an error e between the measured signal u and the estimated signal y such that the error e is minimized.

$u = A \cos(\omega t + \phi) + D = A \cos(\theta) + D \quad (9)$ $y = \hat{A} \cos(\hat{\omega} t + \hat{\phi}) + \hat{D} = \hat{A} \cos(\hat{\theta}) + \hat{D} \quad (10)$ In equation (9), A is the magnitude, ω is the angular frequency, φ is the initial phase angle, θ=ωt+φ is the phase angle, and D is the DC offset of the measured signal u. Similarly, in equation (10), $\hat{A}$ is the estimated magnitude, $\hat{\omega}$ is the estimated angular frequency, $\hat{\phi}$ is the estimated initial phase angle, $\hat{\theta} = \hat{\omega} t + \hat{\phi}$ is the estimated phase angle, and $\hat{D}$ is the estimated DC offset of the estimated signal y.

The error e between the measured signal u and the estimated signal y may be denoted as:

$e = u - y \quad (11)$

An objective function J may be formulated as in equation (12) to minimize the error e.

$J = e^2 = (u - y)^2 \quad (12)$

At a minimum value of the objective function J, the following first-order optimality conditions are satisfied:

$$\frac{\partial J}{\partial P} = 0 \quad (13)$$

where P=[A ω θ D]. Using an optimization method, such as the steepest descent method, the differentiation of each variable in P may be obtained as in equations (14)-(17).

$\dot{A} = 2e \cos \hat{\theta} \quad (14)$ $\dot{\omega} = -2eA \sin \hat{\theta} \quad (15)$ $\dot{\theta} = \omega \quad (16)$ $\dot{D} = 2e \quad (17)$ Based on equations (14)-(17), in the discrete domain, the estimated magnitude $\hat{A}$ may be determined first by using equation (18), where e(n) may be determined from equation (11), n being the discrete time index.

$$\hat{A}(n) = k_1 e(n) \cos \hat{\theta}(n-1) T_s + \hat{A}(n-1) \quad (18)$$

The integral of the estimated angular frequency $\hat{\omega}$, $\hat{\omega}_{int}$ may then be determined as follows:

$$\hat{\omega}_{int}(n) = -k_3 e(n) \hat{A}(n) \sin \hat{\theta}(n-1) T_s + \hat{\omega}_{int}(n-1) \quad (19)$$

The estimated angular frequency $\hat{\omega}$ may be determined using equation (20).

$$\hat{\omega}(n) = -k_2 e(n) \hat{A}(n) \sin \hat{\theta}(n-1) + \hat{\omega}_{int}(n) \quad (20)$$

Equation (21) may then be used to determine the estimated phase angle $\hat{\theta}$.

$$\hat{\theta}(n) = \hat{\omega}(n) T_s + \hat{\theta}(n-1) \quad (21)$$

The integral of the estimated DC offset $\hat{D}$, $\hat{D}_{int}$ may be determined as in equation (22) and the estimated DC offset $\hat{D}$ may be determined as in equation (23).

$$\hat{D}_{int}(n) = k_5 e(n) T_s + \hat{D}_{int}(n-1) \quad (22)$$

$$\hat{D}(n) = k_4 e(n) + \hat{D}_{int}(n) \quad (23)$$

In the equations (18)-(23), $T_s$ is the sampling period of the synchronized measurement device. The coefficients $k_1$, $k_2$, $k_3$, $k_4$, and $k_5$ determine the speed of convergence and the steady-state stability of the EPLL method. An estimated frequency $\hat{f}$ of the estimated signal y may also be determined as follows:

$$\hat{f}(n) = 2\pi \hat{\omega}(n) \quad (24)$$

Figure 6A:
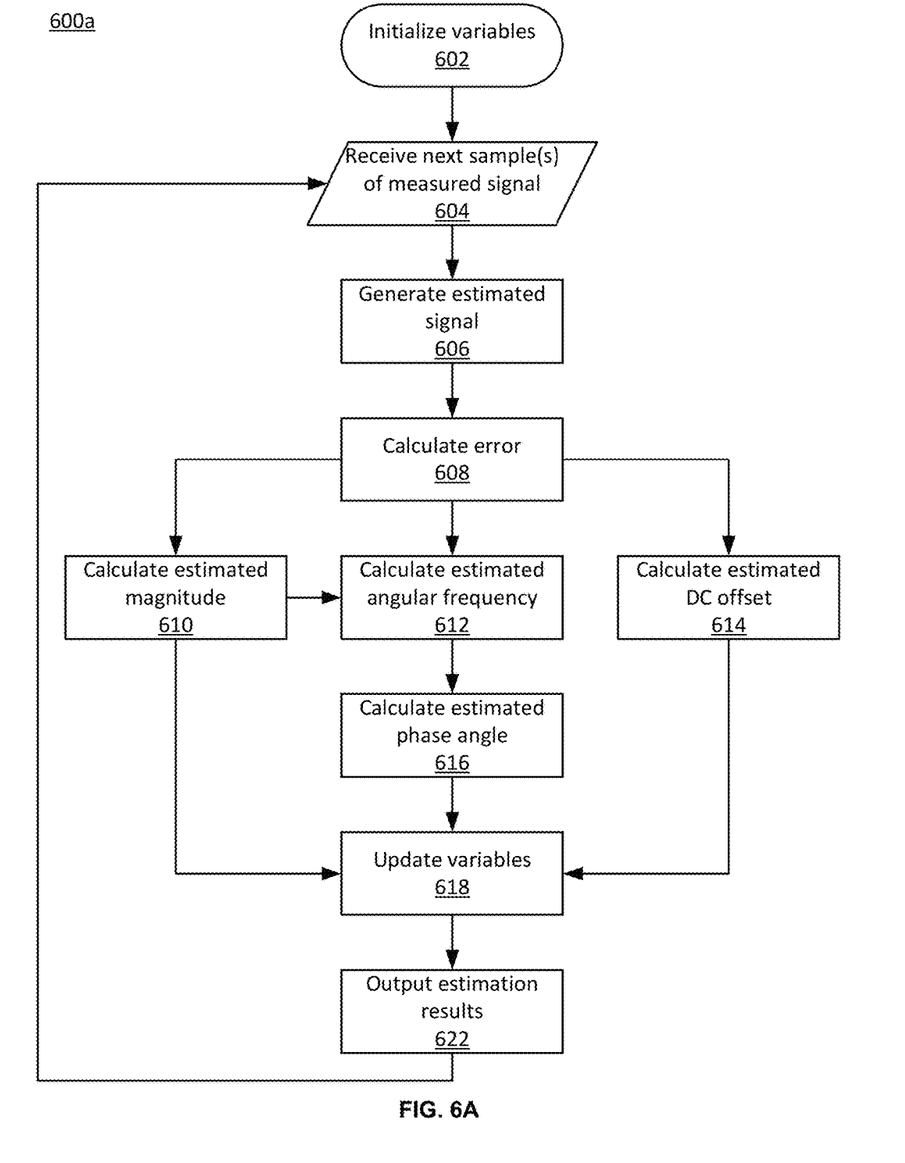
FIG. 6A is a flowchart of an enhanced phase-lock-loop (EPLL) method, according to an embodiment of the present disclosure.

FIG. 6A is a flowchart of an EPLL method 600a, according to an embodiment of the present disclosure. In the EPLL method 600a, the coefficients $k_1$, $k_2$, $k_3$, $k_4$, and $k_5$ are kept fixed. For instance, for a measured signal u with a nominal frequency of 60 Hz and a nominal magnitude of 120 V, $k_1=1600$, $k_2=0.5$, $k_3=40$, $k_4=0.04$, and $k_5=0.001$.

The EPLL method 600a starts at step 602 by initializing the estimated variables described above and also intermediate variables used in generating the estimated variables. The estimated variables are initialized to nominal values. For example, for a power grid with a 120-V 60-Hz nominal voltage, the estimated magnitude $\hat{A}$ is initialized to 120 (i.e., $\hat{A}(0)=120$); the estimated angular frequency $\hat{\omega}$ is initialized to $120\pi$ (i.e., $\hat{\omega}(0)=120\pi$); the estimated phase angle $\hat{\theta}$ is initialized to 0 (i.e., $\hat{\theta}(0)=0$); the estimated DC offset $\hat{D}$ is initialized to 0 (i.e., $\hat{D}(0)=0$). Any intermediate variable is generally initialized to 0. For example, the integral $\hat{\omega}_{int}$ of estimated angular frequency is initialized to 0 (i.e., $\hat{\omega}_{int}(0)=0$) and the integral $\hat{D}_{int}$ of the estimated DC offset is initialized to 0 (i.e., $\hat{D}_{int}(0)=0$).

Once the variables initialized, the EPLL method 600a receives one or more samples of the measured signal u at step 604. The EPLL method 600a generates the estimated signal y at step 606 according to equation (10) and calculates the error e at step 608 according to equation (11). With the calculated error e, the EPLL method 600a calculates the estimated magnitude $\hat{A}$ at step 610 using equation (18), and the estimated DC offset $\hat{D}$ at step 614 using equations (22) and (23). With the calculated error e from step 608 and the calculated estimated magnitude $\hat{A}$ from step 610, the EPLL method 600a calculates the estimated angular frequency $\hat{\omega}$ at step 612 based on equations (19) and (20). The EPLL method 600a may also calculate the estimated frequency $\hat{f}$ at step 612 according to equation (24). At step 616, the EPLL method 600a then calculates the estimated phase angle $\hat{\theta}$ according to equation (21).

The EPLL method 600a updates the variables at step 618 and outputs the estimation results (for the synchronized measurement device to output/transmit externally, for example), in particular the estimated phase angle $\hat{\theta}$ and the estimated frequency $\hat{f}$, at step 622. The EPLL method 600a then repeats steps 604-622 when subsequent one or more samples of the measured signal u are received.

Figure 6B:
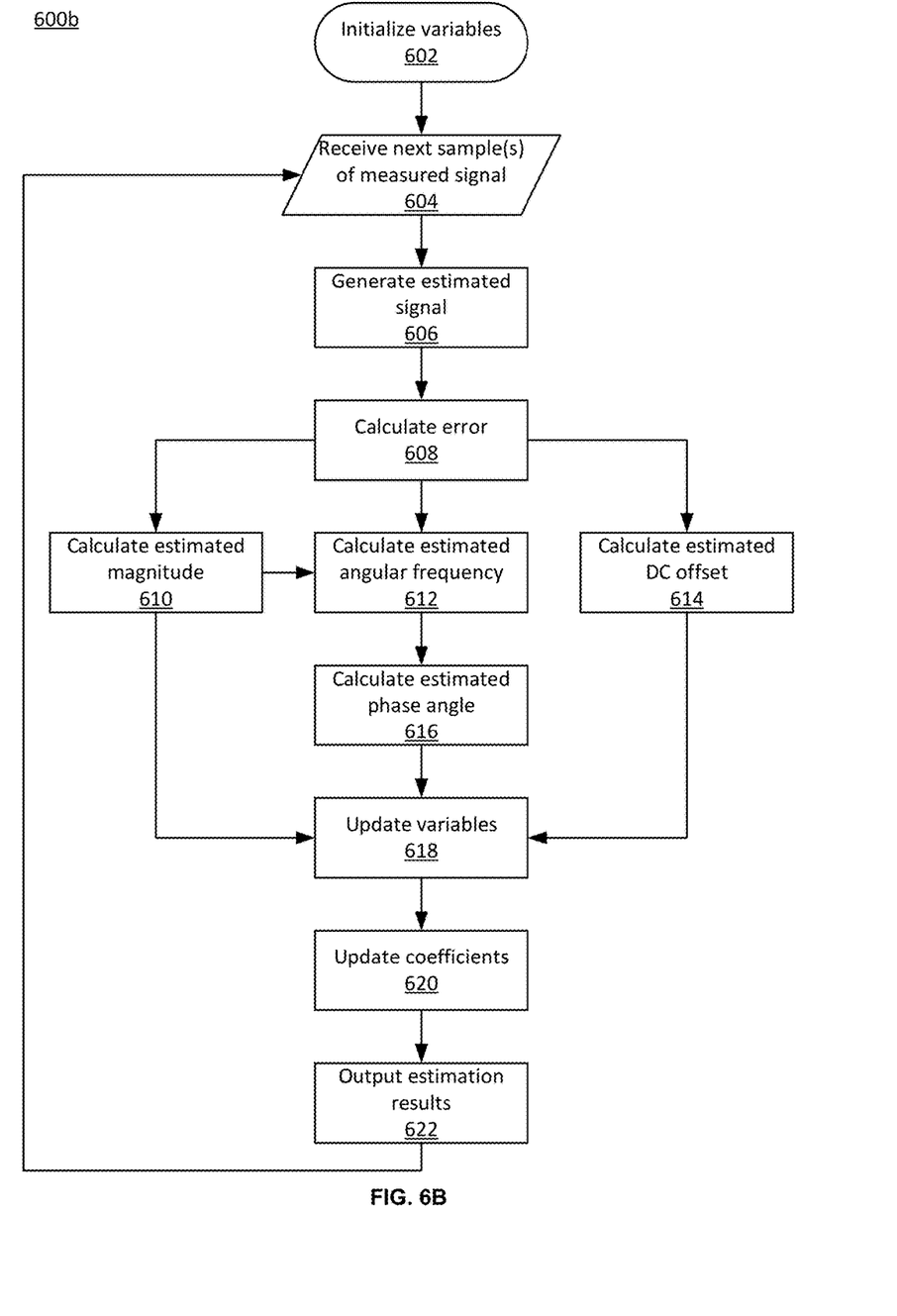
FIG. 6B is a flowchart of an EPLL method, according to another embodiment of the present disclosure.

FIG. 6B is a flowchart of an EPLL method 600b, according to another embodiment of the present disclosure. The EPLL method 600b is similar to the EPLL method 600a, except that the coefficients $k_1$, $k_2$, $k_3$, $k_4$ and $k_5$ are variable. As such, the EPLL method 600b includes an additional step 620 to update the coefficients $k_1$, $k_2$, $k_3$, $k_4$ and $k_5$. At step 620, the EPLL method 600b calculates intermediate coefficients $k_j'$, where $j=\{1, 2, 3, 4, 5\}$, as follows:

$$k_j'(n) = a_j k_j(n-1) + r_j e(n)^2 \quad (25)$$

In equation (25), $0 < a_j < 1$ and $r_j > 1$. The parameters $a_j$ and $r_j$ may be chosen based on a desired performance of the EPLL algorithm and characteristics of the measured signal u. For example, $a_1=0.9$, $r_1=4\times10^{-4}$, $a_2=0.9$, $r_2=4.8\times10^{-2}$, $a_3=0.9$, $r_3=6\times10^{-2}$ $a_4=0.9$, $r_4=4.8\times10^{-3}$, $a_5=0.9$, and $r_5=4.8\times10^{-4}$.

Once the intermediate coefficients $k_j'$ calculated, the EPLL method 600b determines the coefficients $k_j$ as follows:

$$k_j(n) = \begin{cases} k_{jmax} & k_j'(n) > k_{jmax} \\ k_{jmin} & k_j'(n) < k_{jmin} \\ k_j'(n) & \text{otherwise} \end{cases} \quad (26)$$

In equation (26), $k_{jmin}$ and $k_{jmax}$ respectively represent lower and upper boundaries for the corresponding coefficient $k_j$, and may be enforced to keep the EPLL algorithm stable and accurate in situations where there may be disturbances or computational errors, for example. An example of a set of boundaries is $k_{1max}=2000$, $k_{1min}=400$, $k_{2max}=0.7$, $k_{2min}=0.3$, $k_{3max}=60$, $k_{3min}=25$, $k_{4max}=0.08$, $k_{4min}=0.02$, $k_{5max}=0.002$, and $k_{5min}=0.0005$.

Thereafter, the EPLL method 600b outputs the estimation results at step 622, and then repeats steps 604-622 when subsequent one or more samples of the measured signal u are received. Steps 604-618 and 622 of the EPLL method 600b are identical to steps 604-618 and 622 of the EPLL method 600a. Therefore, descriptions of steps 604-618 and 622 of the EPLL method 600b will be omitted.

Figure 6C:
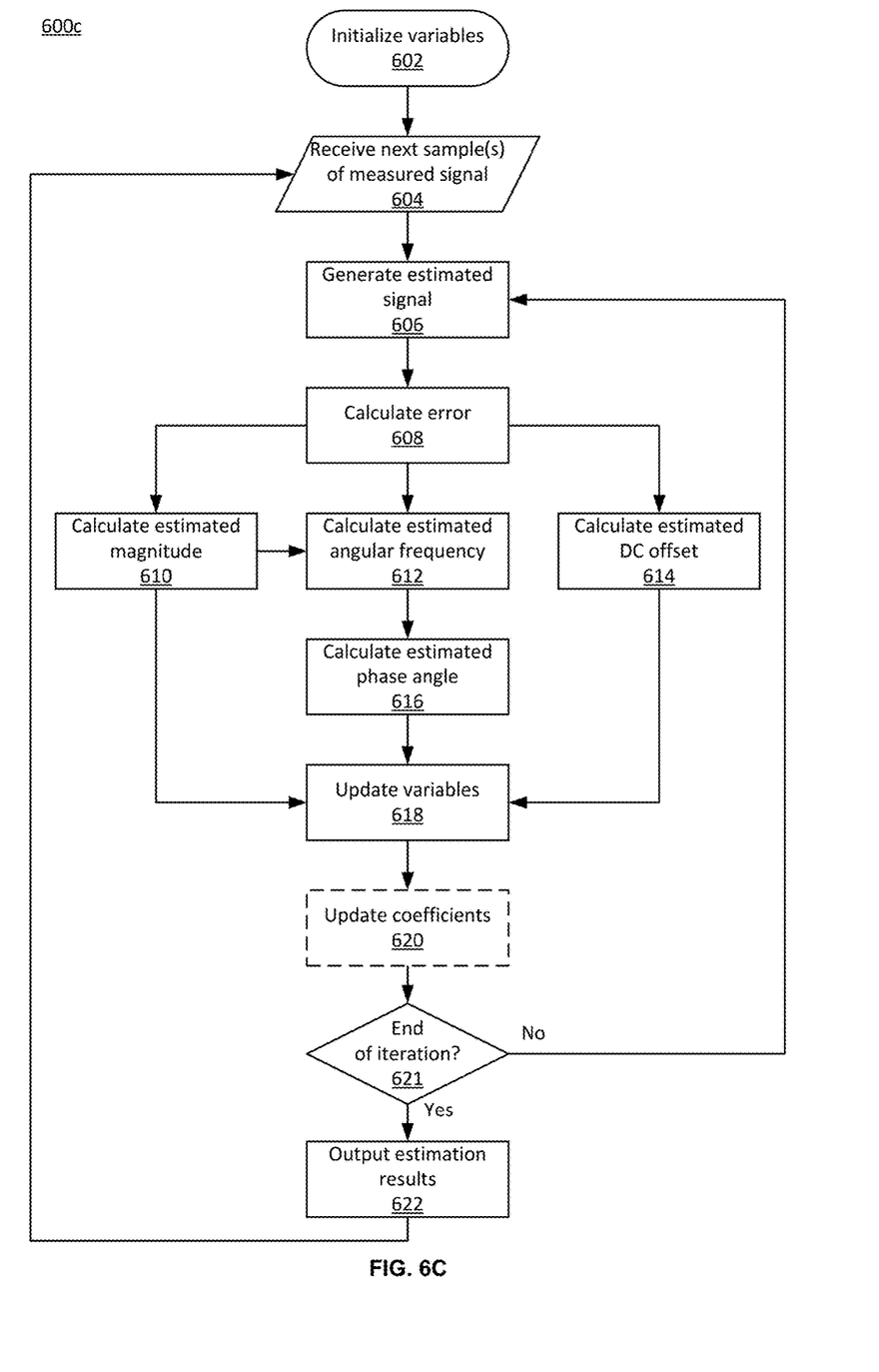
FIG. 6C is a flowchart of an EPLL method, according to yet another embodiment of the present disclosure.

FIG. 6C is a flowchart of an EPLL method 600c, according to yet another embodiment of the present disclosure. Unlike the EPLL methods 600a and 600b, the EPLL method 600c includes, between subsequent one or more samples of the measured signal u, multiple iterations of the estimated variables computations in order to determine the estimated variables more accurately, thereby improving the performance of the EPLL algorithm following a change in the measured signal u.

As illustrated in FIG. 6C, the EPLL method 600c includes step 621, where it is determined whether the iteration has reached an end, for example, by checking whether the number of iterations has reached a maximum number of iterations M. If the maximum number of iterations has not been reached, the EPLL method 600c repeats steps 606-621. Otherwise, the EPLL method 600c outputs the estimation results at step 622, and then repeats steps 604-622 when subsequent one or more samples of the measured signal u are received.

The maximum number of iterations M may be chosen based on a desired performance and a desired computation speed of the EPLL algorithm. A larger M may improve the dynamic performance of the EPLL algorithm, but may increase the computation burden. An exemplary value of M is 10.

With an iteration index i, equations (10), (11), and (18)-(24) may be modified as equations (27)-(35), respectively, as follows:

$$y_i(n)=\hat{A}_M(n-1)\cos(\hat{\theta}_M(n-1))+\hat{D}_M(n-1) \quad (27)$$

$$e_i(n)=u(n)-y_i(n) \quad (28)$$

$$\hat{A}_i(n)=k_1(n)e_i(n)\cos\theta(n-1)T_s+\hat{A}_{i-1}(n) \quad (29)$$

$$\hat{\omega}_{inti}(n)=-k_3(n)e_i(n)\hat{A}_i(n)\sin\hat{\theta}_{i-1}(n)T_s+\hat{\omega}_{int(i-1)}(n) \quad (30)$$

$$\hat{\omega}_i(n)=-k_2(n)e_i(n)\hat{A}_i(n)\sin\hat{\theta}_{i-1}(n)+\hat{\omega}_{int(i-1)}(n) \quad (31)$$

$$\hat{\theta}_i(n)=\hat{\omega}_i(n)T_s+\hat{\theta}_M(n-1) \quad (32)$$

$$\hat{D}_{inti}(n)=k_5(n)e_i(n)T_s+\hat{D}_{int(i-1)}(n) \quad (33)$$

$$\hat{D}_i(n)=k_4(n)e_i(n)+\hat{D}_{int(i-1)}(n) \quad (34)$$

$$\hat{f}_i(n)=2\pi\hat{\omega}_i(n) \quad (35)$$

Therefore, the EPLL method 600c invokes equations (27)-(35) accordingly in steps 606-616 for i={1, 2, ..., M} iterations. The coefficients $k_1$, $k_2$, $k_3$, $k_4$ and $k_5$ may be fixed as in EPLL method 600a, in which case the step 620 is not needed in the EPLL method 600c. However, the coefficients $k_1$, $k_2$, $k_3$, $k_4$ and $k_5$ may also be updated in every iteration i, as described above with respect to the EPLL method 600b, in which case the EPLL method 600c includes the step 620.

It is to be appreciated that the EPLL methods 600a-600c may compute and output the estimated frequency $\hat{f}$ and phase angle $\hat{\theta}$ whenever a sample of the measured signal u is available. Thus, if the sampling rate is between 720 Hz and 36 kHz for any of the EPLL methods 600a-600c, the corresponding reporting rate will also be between 720 Hz and 36 kHz, which is much faster than the conventional DFT output rate of 10 Hz to 60 Hz. Accordingly, the EPLL methods 600a-600c are suitable for power grid situational awareness, event analysis, and transient stability control. It is to be also appreciated that the implementations of the EPLL methods 600a-600c are not limited to any particular programming language or execution environment, and the method 200 may be applied to any computer programming languages or logic.

Embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations that are consistent with the principles described above are permissible.

What is claimed is:

1. A synchrophasor measurement method for a device configured to take synchronized measurements in a power system, comprising:
   receiving global positioning system (GPS)-synchronized samples of a signal sensed by the device from the power system;
   determining a level of distortion of the signal;
   selecting, based on the level of distortion, a computation method, the computation method being one of an improved zero-crossing (IZC) method and an enhanced phase-lock-loop (EPLL) method;
   performing the selected computation method to determine at least one parameter of the signal at a reporting frequency, which is at least twice a line frequency of the power system; and
   outputting, at the reporting frequency, the at least one parameter to an operator of the power system to allow the operator to perform at least one of a monitoring and a controlling of at least one element of the power system.

2. The synchrophasor measurement method of claim 1, wherein the signal is one of a voltage and a current signal.

3. The synchrophasor measurement method of claim 1, wherein the determining the level of distortion comprises computing a total harmonic distortion of the signal.

4. The synchrophasor measurement method of claim 1, wherein performing the IZC method comprises:
   representing a vector x of a subset of the samples in the form of x=αM, α being a vector of a first coefficient and a second coefficient, and M being a constant-valued matrix;
   performing a pseudo-inverse computation α=[$M^TM$]$^{-1}M^Tx$ to determine the first coefficient and the second coefficient;
   interpolating between the subset of the samples, using the first coefficient and the second coefficient, to generate a polynomial function;
   determining a zero-crossing location as a point where the polynomial function is zero;
   repeating, for subsequent subsets of the samples, the representing, performing, interpolating, and determining steps to determine subsequent zero-crossing locations; and
   computing, after determining each zero-crossing location, the at least one parameter of the signal based on at least the last three subsequent zero-crossing locations.

5. The synchrophasor measurement method of claim 1, further comprising, when performing the IZC method, setting a sampling rate of the device to 100 kHz.

6. The synchrophasor measurement method of claim 1, wherein performing the EPLL method comprises:
   initializing a magnitude, a phase angle, an angular frequency, and a direct-current (DC) offset of an estimated signal;
   generating the estimated signal with the magnitude, phase angle, angular frequency, and DC offset;
   determining an error between the estimated signal and the signal sensed by the device;
   updating, based on the error, the magnitude, the phase angle, the angular frequency, and the DC offset;
   calculating a frequency of the estimated signal based on the updated angular frequency;
   providing at least one the calculated frequency and the updated magnitude, phase angle, angular frequency, and DC offset as the at least one parameter; and
   repeating, for every new sample of the signal sensed by the device, the generating, determining, updating, calculating, and providing steps.

7. The synchrophasor measurement method of claim 6, further comprising iteratively performing the generating, determining, updating, and calculating steps for a predetermined number of iterations prior to the providing step.

8. The synchrophasor measurement method of claim 1, further comprising, when performing the EPLL method, setting a sampling rate of the device to between 720 Hz and 36 kHz.

9. The synchrophasor measurement method of claim 1, wherein the at least one parameter includes at least one of a magnitude, a frequency, a phase angle, an angular frequency, and a DC offset.

10. The synchrophasor measurement method of claim 1, wherein the at least one element of the power system includes at least one of a generator, a switch, a transformer, a transmission line, and a power-consuming load.

11. An electronic device for a power system, comprising:
a sensor;
a global positioning system (GPS) receiver;
one or more processors; and
memory storing instructions adapted to be executed by the one or more processors to perform operations comprising:
receiving samples of a signal sensed by the sensor from the power system, the samples being synchronized to an output of the GPS receiver;
determining a level of distortion of the signal;
selecting, based on the level of distortion, a computation method, the computation method being one of an improved zero-crossing (IZC) method and an enhanced phase-lock-loop (EPLL) method;
performing the selected computation method to determine at least one parameter of the signal at a reporting frequency, which is at least twice a line frequency of the power system; and
outputting, at the reporting frequency, the at least one parameter to an operator of the power system to allow the operator to perform at least one of a monitoring and a controlling of at least one element of the power system.

12. The electronic device of claim 11, wherein the signal is one of a voltage and a current signal.

13. The electronic device of claim 11, wherein the operation of determining the level of distortion comprises computing a total harmonic distortion of the signal.

14. The electronic device of claim 11, wherein the operation of performing the IZC method comprises:
representing a vector x of a subset of the samples in the form of x=αM, α being a vector of a first coefficient and a second coefficient, and M being a constant-valued matrix;
performing a pseudo-inverse computation α=[$M^T M$]$^{-1}M^T x$ to determine the first coefficient and the second coefficient;
interpolating between the subset of the samples, using the first coefficient and the second coefficient, to generate a polynomial function;
determining a zero-crossing location as a point where the polynomial function is zero;
repeating, for subsequent subsets of the samples, the representing, performing, interpolating, and determining steps to determine subsequent zero-crossing locations; and computing, after determining each zero-crossing location, the at least one parameter of the signal based on at least the last three subsequent zero-crossing locations.

15. The electronic device of claim 11, the operations further comprising, when performing the IZC method, setting a sampling rate of the electronic device to 100 kHz.

16. The electronic device of claim 11, wherein the operation of performing the EPLL method comprises:
initializing a magnitude, a phase angle, an angular frequency, and a direct-current (DC) offset of an estimated signal;
generating the estimated signal with the magnitude, phase angle, angular frequency, and DC offset;
determining an error between the estimated signal and the signal sensed by the device;
updating, based on the error, the magnitude, the phase angle, the angular frequency, and the DC offset;
calculating a frequency of the estimated signal based on the updated angular frequency;
providing at least one the calculated frequency and the updated magnitude, phase angle, angular frequency, and DC offset as the at least one parameter; and
repeating, for every new sample of the signal sensed by the sensor, the generating, determining, updating, calculating, and providing steps.

17. The electronic device of claim 16, the operations further comprising iteratively performing the generating, determining, updating, and calculating steps for a predetermined number of iterations prior to the providing step.

18. The electronic device of claim 11, the operations further comprising, when performing the EPLL method, setting a sampling rate of the electronic device to between 720 Hz and 36 kHz.

19. The electronic device of claim 11, wherein the at least one parameter includes at least one of a magnitude, a frequency, a phase angle, an angular frequency, and a DC offset.

20. The electronic device of claim 11, wherein the at least one element of the power system includes at least one of a generator, a switch, a transformer, a transmission line, and a power-consuming load.

\* \* \* \* \*